United States Patent [19]
McLaury

[11] Patent Number: 5,657,266
[45] Date of Patent: Aug. 12, 1997

[54] SINGLE ENDED TRANSFER CIRCUIT

[75] Inventor: Loren L. McLaury, Boise, Id.

[73] Assignee: Micron Technology, Inc., Boise, Id.

[21] Appl. No.: 497,071

[22] Filed: Jun. 30, 1995

[51] Int. Cl.$^6$ ................................... G11C 11/24
[52] U.S. Cl. ............... 365/149; 365/230.05; 365/154; 365/230.09
[58] Field of Search ................ 365/149, 230.05, 365/154, 156, 230.09

[56] References Cited

U.S. PATENT DOCUMENTS

| | | | |
|---|---|---|---|
| 4,891,794 | 1/1990 | Hush et al. | 365/189.04 |
| 5,235,545 | 8/1993 | McLaury | 365/189.04 |
| 5,265,050 | 11/1993 | McLaury | 365/189.01 |
| 5,282,177 | 1/1994 | McLaury | 365/230.05 |
| 5,311,478 | 5/1994 | Zagar et al. | 365/230.06 |
| 5,323,350 | 6/1994 | McLaury | 365/208 |
| 5,325,329 | 6/1994 | Inoue et al. | 365/189.05 |
| 5,325,502 | 6/1994 | McLaury | 395/425 |
| 5,369,622 | 11/1994 | McLaury | 365/233 |
| 5,394,172 | 2/1995 | McLaury | 345/200 |
| 5,450,355 | 9/1995 | Hush | 365/230.05 X |
| 5,490,112 | 2/1996 | Hush et al. | 365/230.05 X |

OTHER PUBLICATIONS

"VRAM—256L + 8 DRAM with 512 + 8 SAM;" *Specialty DRAM—Graphics/Communications 1993 Data Book*; Micron Semiconductor, Inc.; pp. 2–139—2–180 (1993).

*Primary Examiner*—David C. Nelms
*Assistant Examiner*—Huan Hoang
*Attorney, Agent, or Firm*—Schwegman, Lundberg, Woessner & Kluth, P.A.

[57] ABSTRACT

A transfer circuit and method are described for transferring data between a static memory and a dynamic memory. The static memory is a Serial Access Memory, SAM, and the dynamic memory is a Dynamic Random Access Memory, DRAM. The transfer circuit includes a single transfer line selectively coupled to both memories. The static memory and the single transfer line can be pre-charged, or equilibrated to a predetermined voltage level. Transfers of data are performed by coupling a memory cell to the single transfer line so that the transfer line voltage is changed from the predetermined voltage level and then coupled to another memory cell.

13 Claims, 13 Drawing Sheets

SINGLE ENDED TRANSFER CIRCUIT

TECHNICAL FIELD OF THE INVENTION

The present invention relates generally to integrated circuit memories and in particular the present invention relates to transfers of data between a static memory and a dynamic memory.

BACKGROUND OF THE INVENTION

Multi-port random access memories (RAM) are substantially faster than standard RAM and commonly referred to as video random access memories (VRAM) because of their effectiveness in video systems. In its simplest form, a multi-port memory includes a dynamic random access memory (DRAM), a DRAM controller, at least one serial memory and a serial memory controller. Each serial memory is essentially a long shift register which can receive a block of data from the DRAM and serially shift the data out through a serial data port. Each serial memory can also serially shift data in through the serial port and transfer data to the DRAM.

The DRAM is a dynamic array for storing multiple bit registers in multiple two dimensional planes each having rows and columns. Each bit register is defined by the same row and column addresses in each of the planes. Each serial memory has a bit register row associated with one of each of the planes of the DRAM such that the columns of the DRAM correspond to the bits of the register row.

In general, the DRAM and serial memory can operate either independently or in combination for internal transfers of data. When operating in combination, the serial memory is structured to allow access to one row of the DRAM. Assuming, in a DRAM having 512 column addresses in each row, a serial memory can read or write to addresses 0–511 of one row of the DRAM. This configuration allows for both bi-directional internal transfers of data between the DRAM and the serial memory and independent access to each memory.

The DRAM is comprised of an arrangement of individual memory cells. Each memory cell typically comprises a capacitor capable of holding a charge and an access transistor for accessing the capacitor charge. The charge is referred to as a data bit and can be either a high voltage or a low voltage. Data can be either stored in the memory cells during a write mode, or data may be retrieved from the memory cells during a read mode. The data is transmitted on signal lines, referred to as Digit lines, which are coupled to input/output lines through transistors used as switching devices. For each bit of data stored, its true logic state is available on an I/O line and its complementary logic state is available at on an I/O compliment line. Thus, each memory cell has two digit lines, Digit and Digit complement.

Typically, the memory cells are arranged in an array and each cell has an address identifying its location in the array. The array comprises a configuration of intersecting rows with a memory cell at each intersection. In order to read from, or write to a cell, the particular cell in question must be addressed. The address for the memory cell is represented by input signals to a row decoder and to a column decoder. The row decoder activates a word line in response to the row address. The selected word line activates the access transistors for each of the memory cells in communication with the selected word line. The column decoder selects a Digit line pair in response to the column address. For a read operation the selected word line activates the access transistors for a given row address, and data is latched to the digit line pairs.

As stated, conventional dynamic memories use memory cells fabricated as capacitors in an integrated circuit to store data. That is, a logical "1" is stored as a charge on the capacitor and the capacitor is discharged for a logical "0". The pairs of digit lines are connected to both memory cells and sense amplifiers. These sense amplifiers are utilized to sense small differentials on the digit line pairs and drive the digit lines to full power supply rails for either reading the memory cells or writing thereto. Once the data has been sensed it can be transmitted to a serial memory via the digit line pairs.

In general, to transfer data from a DRAM to a serial memory, such as a serial access memory (SAM), the data stored in the DRAM is sensed as a differential voltage and then the memories are connected using two transfer lines. If the SAM is storing data which is different from the data being transferred from the DRAM, the DRAM must overwrite the SAM. This operation is both time consuming and requires a substantial amount of current.

Further, to respond to the demand for integrated dynamic memory circuits having more storage potential, the size of the individual memory cells have been reduced to fit more memory cells into the same integrated circuit die. The sense amplifiers used to sense data stored in the dynamic memory cells have not been reduced sufficiently, however, to allow the sense amplifiers to be single pitched with the memory cells, complex memory array to sense amplifier layouts cannot be avoided, particularly if sense amps are shared for efficiency. As a result of complex layouts, transfer circuitry between the DRAM and the SAM requires that the die area be increased to accommodate pairs of transfer lines. The full efficiency of the reduced memory cell size used in the integrated memory circuit, therefore, cannot be fully exploited. A transfer circuit is needed which can transfer data between a DRAM and a SAM with less operating current and a reduced die area requirement.

For the reasons stated above, and for other reasons stated below which will become apparent to those skilled in the art upon reading and understanding the present specification, there is a need in the art for a transfer circuit and method for transferring data between a static memory and a dynamic memory using a single transfer line.

SUMMARY OF THE INVENTION

The above mentioned problems with transfer circuits in integrated memory circuits and other problems are addressed by the present invention and which will be understood by reading and studying the following specification. An integrated memory circuit is described which has a transfer circuit for reading and writing data between a static memory and a dynamic memory using a single transfer line.

In particular, the present invention describes an integrated memory circuit which comprises a dynamic memory array having dynamic memory cells, a static memory having static memory cells, and single transfer lines coupled to the static memory and the dynamic memory, each for transferring data between the dynamic memory cells and the static memory cells. The memory circuit can include a pre-charge circuit connected to the single transfer lines for charging the single transfer lines to a pre-determined voltage level.

In another embodiment, the memory includes pass circuitry electronically located between the static memory and the single transfer lines for selectively coupling the static memory cells to the single transfer lines. Further, memory cell pass circuitry can be electrically located between the dynamic memory cells and the single transfer lines, for selectively coupling the dynamic memory cells to the single transfer lines. In yet another embodiment, the memory can include equilibration circuitry connected to the static memory cells for equilibrating the static memory cells to a predetermined voltage level.

Another embodiment describes a method of reading data from a dynamic memory array having dynamic memory cells with a static memory having static memory cells. The method comprises the steps of equilibrating the static memory cells to a predetermined voltage level, pre-charging a single transfer line to the predetermined voltage level, and coupling one of the dynamic memory cells to a sense amplifier. The method also includes the steps of selectively coupling the sense amplifier to the single transfer line, and selectively coupling one of the static memory cells to the single transfer line.

A method is provided for writing to a dynamic memory array having dynamic memory cells from a static memory having static memory cells. The method comprises the steps of selectively coupling data stored on one of the static memory cells to a single transfer line, and equalizing a sense amplifier associated with one of the plurality of dynamic memory cells. The method also includes the steps of selectively coupling the sense amplifier to the single transfer line, selectively coupling the one of the dynamic memory cells to the sense amplifier, and strobing the sense amplifier to sense and amplify a signal on the single transfer line.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

This invention concerns electrical circuitry which uses voltages to represent the two binary logic levels. The words "low" and "high" in this specification refer generally to the false and true binary logic levels, respectively. Signals are generally considered active when they are high, however, an asterisk (*) following the signal name, or a bar above the signal name in this application indicates that the signal is negative or inverse logic. Negative or inverse logic is considered active when the signal is low.

Figure 1:
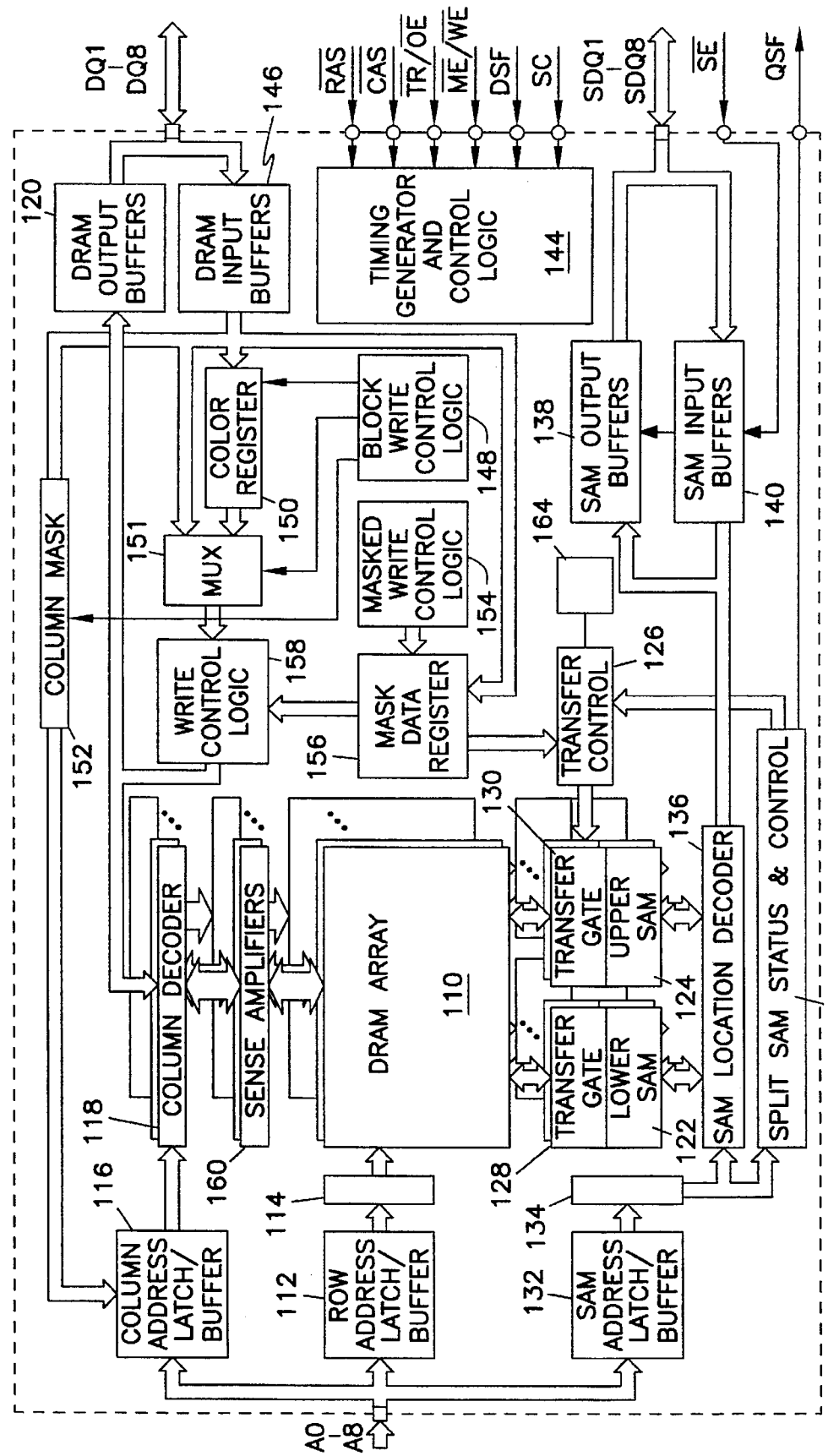
FIG. 1 is a block diagram of a multi-port memory incorporating the present invention.

FIG. 1 illustrates a block diagram of a multi-port memory incorporating the present invention. The multi-port memory is similar to the VRAM available as part number MT42C8256 produced by Micron Technology Inc., Boise, Id., the assignee of the present invention. A complete description of this memory can be found in Micron Semiconductor, Inc. Data Book, page 2–139 to 2–179 (1993), incorporated herein by reference.

DRAM 110 is a 512 by 512 by 8 bit array which can be accessed by a microprocessor (not shown) through input/output connections including address lines A0–A8. Row address latch/buffer 112 and row decoder 114 decode a row address from a row address signal provided on A0–A8, and address the corresponding row of the DRAM. Likewise, column address latch/buffer 116 and column decoder 118 decode a column address from a column address signal provided on A0–A8, and address the corresponding column of the DRAM. Data stored in the DRAM 110 can be transferred to outputs DQ1–DQ8 through DRAM output buffers 120.

Two 256×8 bit serial access memories, SAM's 122 and 124, are provided as independent memories and connected to the DRAM for internal transfers of data. SAM 122 is dedicated to internal transfers with DRAM 110 column addresses 0 through 255 and SAM 124 is dedicated to internal transfers with column addresses 256 through 511 of any given row. DRAM 110 and SAM's 122 and 124 can operate as described above either independently or in limited combination for internal data transfers. Transfer control circuit 126 controls the internal transfer of data between the SAM's and the DRAM using transfer gates 128 and 130. The address location of the SAM's are controlled through address lines A0–A8 using SAM address latch/buffer 132, SAM address counter 134 and SAM location decoder 136. SAM serial output is provided on lines SDQ1–SDQ8 through SAM output buffers 138. Likewise, serial input to the SAM's are controlled on lines SDQ1–SDQ8 through SAM input buffer 140. Split SAM status and control 137 provides SAM status feedback to the transfer control 126.

Timing generator and control logic 144 is used to control the many available functions of DRAM 110. DRAM data input is provided on lines DQ1–DQ8 through DRAM input buffers 146. MUX 151 multiplexes the DQ input lines and the color register 150 to write control logic 158. Block write control logic 148, color register 150 and column mask 152 are used to control custom features of the multi-port memory. Masked write control logic 154, masked data register 156, and write control logic 158 are used to control masking features. Sense amplifiers 160 are used to detect and amplify data stored in the DRAM.

The present invention is described in a multi-port memory, however, it will be understood that any memory incorporating a dynamic memory array and a static memory can be used without departing from the spirit of the present invention.

Input and Output Connections

The input and output connections of the multi-port memory used to communicate with a micro processor are described as follows. Serial clock input (SC) to the timing generator and control logic 144 provides the clock input for the SAM address latch/buffer 132 and SAM address counter 134 for each of the SAM memories. Transfer enable/output enable (TR*/OE*) input provides for the internal transfer of data between the DRAM and the SAM's and also enables the output buffers 120 of the DRAM. The masked enable/ write enable (ME*/WE*) input is used to perform a masked write function. The ME*/WE* can also be used to select a read or write cycle when accessing the DRAM, this includes a read transfer or write transfer with the SAM's. The serial port enable (SE*) input is used to enable the SAM input buffers 140 and output buffers 138. Special function select input (DSF) is used to indicate which special function (block write, flash write, split transfer, etc.) are used for a particular access cycle. Row address strobe (RAS*) input is used to clock in the nine row address bits and strobe for ME*/WE*, TR*/OE*, DSF, SE*, CAS*, and DQ inputs. In standard multi-port memories, the RAS* also acts as the master chip enable and must fall for the initiation of any DRAM or transfer function. Column address strobe (CAS*) input is used to clock in the nine column address bits and as a strobe for the DSF input for a block write function.

Address input lines A0–A8 are used to identify a row and column address to select at least one 8 bit word or register out of the 262,144 available words, as detailed above. DRAM data input/output lines DQ1–DQ8 provide data input and output for the DRAM and also act as inputs for mask data register 156 and color register 150. Serial data input/output lines SDQ1–SDQ8 provide data input and output to the SAM's 122 and 124. SAM's split status output (QSF) indicates which half of the SAM is being accessed, a low indicates addresses 0–255 are being accessed, while a high indicates addresses 256–511 are being addressed.

Transfer Functions

Read and write transfer functions can be performed between the DRAM and a SAM. The following method relates to a typical read transfer function used in dual port DRAMs and multiport DRAMs. It also applies, however, to single port DRAMs like cache DRAMs, were data is transferred from a dynamic memory to some from of static latch or serial memory such as a SAM. This data transfer can be an entire row of data bits accessed in the dynamic memory, or a half row or a portion of a row. Further, half serial memory (or half length static cell) approaches can be used on dual port DRAMs.

To perform a read transfer, the inputs are examined during a RAS* cycle (RAS* falls). If the inputs are such that TR*/OE* is low, ME*/WE* is high, and DSF is low, a read transfer function is to be performed from a DRAM row to the SAM. The presence of a row address on the address pins A0–A8 is signalled when RAS* falls.

Figure 2:
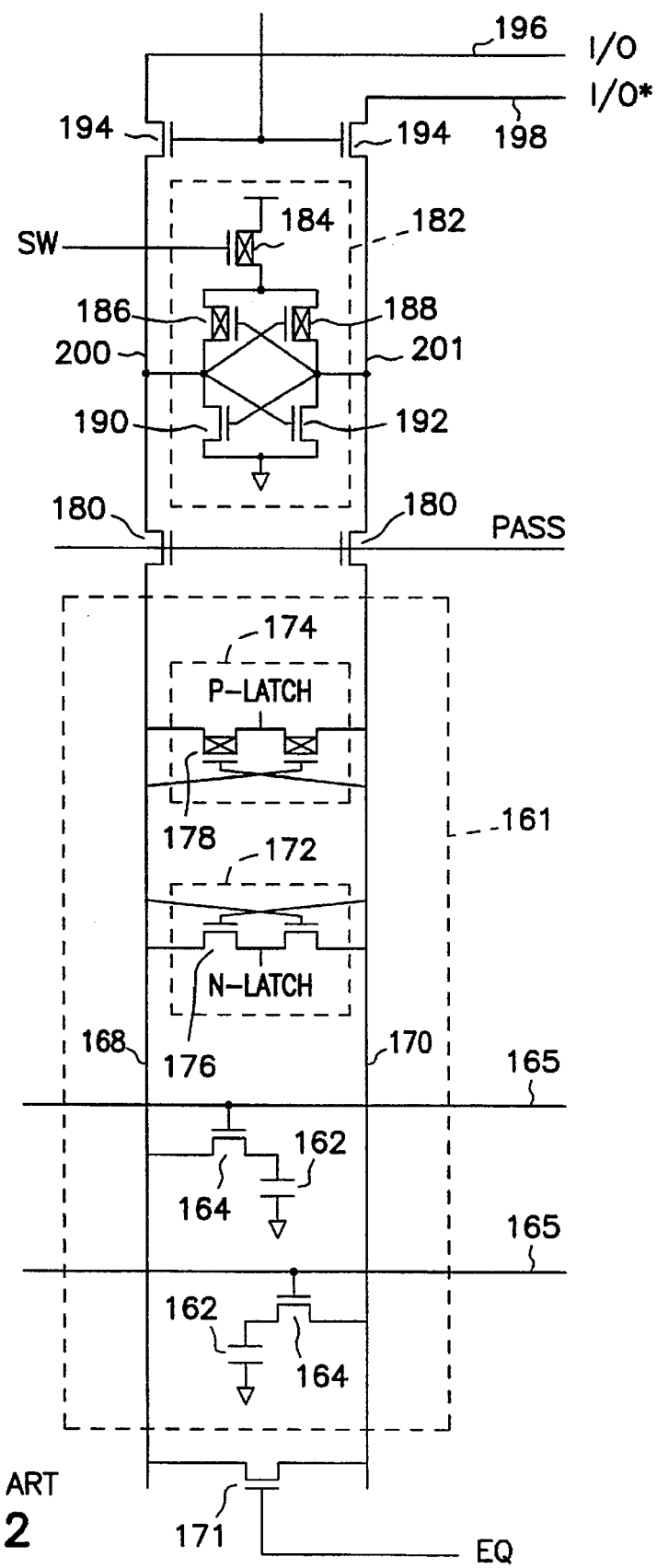
FIG. 2 is a portion of a related dynamic memory and coupled static memory.

Referring to FIG. 2, the typical sensing and transfer circuits are described. The dynamic memory 161 has memory cells 162 formed as capacitors which store data as a charge. As stated above, a logical one is typically stored as a charge on the capacitor and a logical zero is typically stored as a discharged capacitor. An n-channel access transistor 164 is connected to each memory cell such that its source is connected to a memory cell and its drain is connected to one of the digit lines 168 or 170. The access transistor is activated by raising its gate potential using one of the addressable word lines 165. The memory cells, therefore, can be electrically coupled to a Digit line 168 or a Digit* line 170. An equilibrate transistor 171 is provided to equalize the digit line pair using the EQ input. An n-sense amplifier 172 and a p-sense amplifier 174 are connected to the two digit lines 168 and 170. The n-sense amplifier is comprised of a pair of cross-coupled n-channel transistors 176. The sources of these transistors are connected to a common NLatch line. The NLatch line is typically held at one-half the supply voltage (Vcc) and strobed low to sense data stored on a selected memory cell. Likewise, the p-sense amplifier is comprised of a pair of cross-coupled p-channel transistors 178. The sources of the p-channel transistors are connected to a common PLatch line which is normally held to Vcc/2 and strobed high to sense data stored on the memory cells.

Pass transistors 180 are used to connect the digit lines 168 and 170 to a static addressable memory cell 182. As explained above, the static memory can be a SAM. The static memory cell is comprised of three p-channel transistors 184, 186 and 188, and two n-channel transistors 190 and 192. I/O enable transistors 194 are provided to electrically connect one of the static memory cells 182 to I/O line 196 and its complement I/O line 198.

Figure 3:
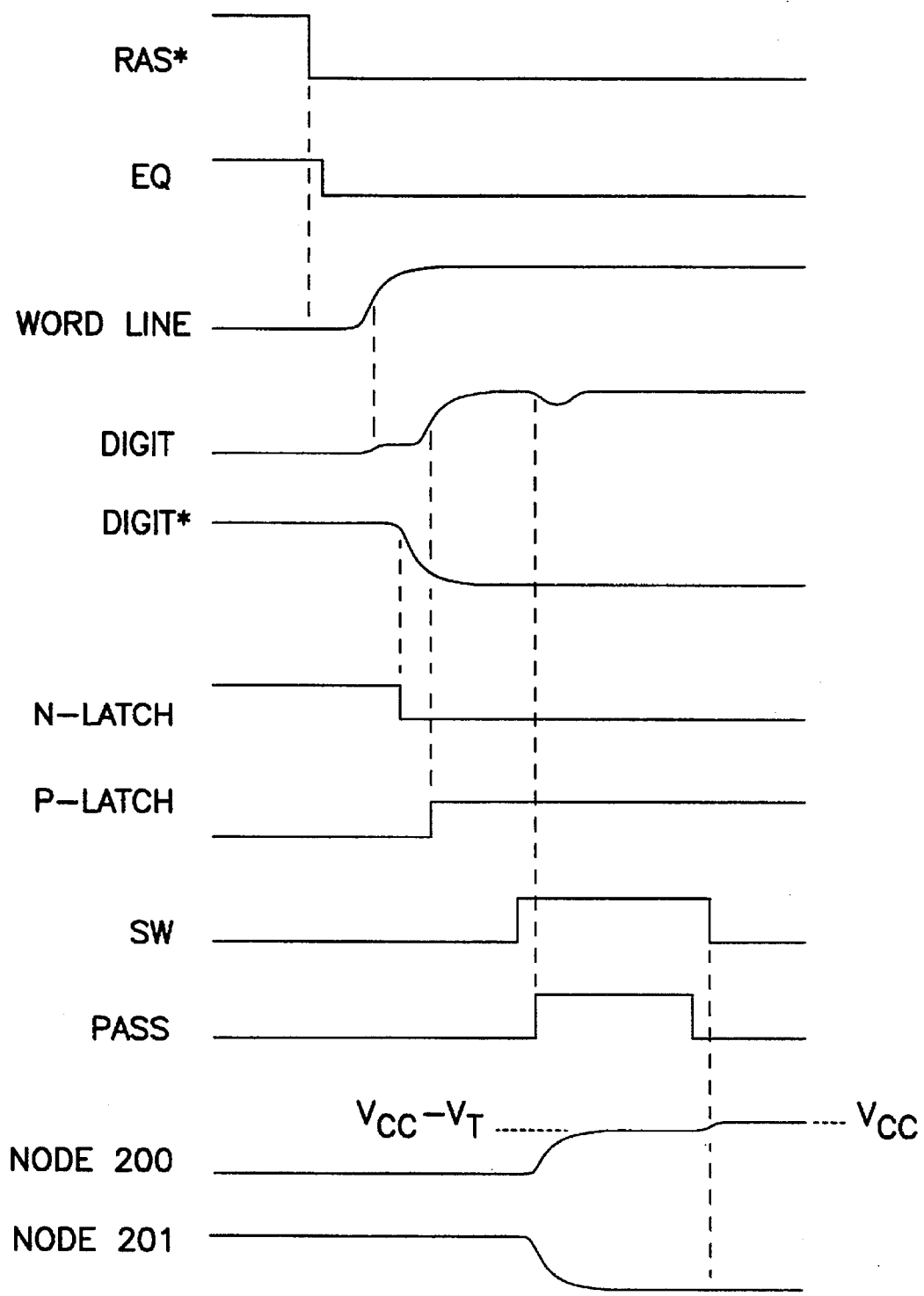
FIG. 3 is a timing diagram for the circuit of FIG. 2.

To transfer data during a RAS* cycle, the digit lines are in equilibration by the activated equilibrate transistor 171 which couple the digit lines to Vcc/2, as shown in FIG. 3. Immediately after RAS* goes low, the equilibrate transistor is turned off by lowering its gate voltage (EQ). Next, a selected word line 165 is activated and the associated access transistor 164 is mined on to connect a memory cell 162 to one of the digit lines 168 or 170. The charge shared by the memory cell with the digit line will change the digit line potential by approximately ±200 mv. The differential between the digit lines is then sensed using the n-sense 172 and p-sense 174 amplifiers, as known to one skilled in the art. The NLatch line is lowered such that the digit line with a potential a threshold level above the NLatch level will activate one of the transistors 176 and pull the other digit line low. The p-sense amplifier is then strobed by raising the PLatch line. The digit line which was pulled low by the n-sense amplifier will activate one of the transistors 178 so that the other digit line is pulled high. After both sense amplifiers have been strobed, the digit lines are at full power rail potentials, Vcc or ground.

At some point, enough signal develops on the digit lines such that the data is ready for transfer. The read transfer sequence is begun by disabling the static memory cell's pull up capability by raising the SW signal to turn-off transistor 184. The pull down transistors 190 and 192 are not disabled. At this point the transfer gate between the dynamic memory and the static memory is activated by raising the PASS line. Thus, the activated dynamic memory is coupled to the partially deactivated static memory. In an overwrite case, where the state of the dynamic memory is different from the state of the static memory, the digit line which has a high potential activates one of the pull down transistors 190 or 192 and the other digit line turns-off the other pull down transistor 190 or 192. This pulls the high side of the static memory cell low. At this point the static memory cell has been over-written and the transfer transistors 180 are turned-off by the PASS line going low. The SW line returns low to re-enable the static memory cell pull-up transistor 184. Thus, the read transfer and over-write is complete.

It can be seen that to over-write data stored in the static memory cell, a substantial current is incurred by the p-sense amplifier. The static memory equilibrate circuit shown in FIG. 4 reduces the current used to perform a read transfer operation from a dynamic memory cell to a static memory cell. By adding an equilibrate circuit to the static memory cell and providing a switchable lower reference voltage, the static memory can be equilibrated prior to a read transfer operation.

Figure 4:
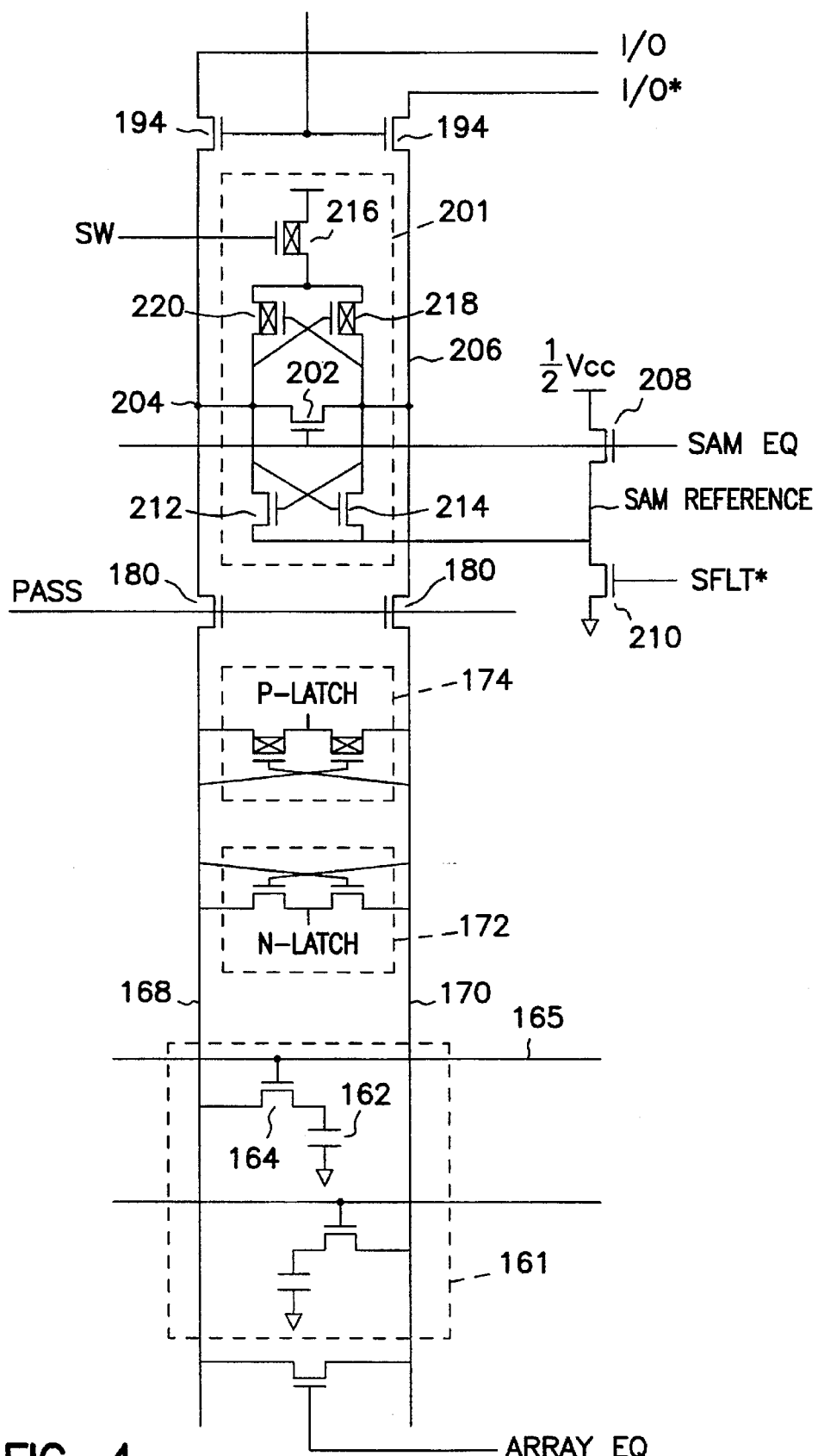
FIG. 4 is a schematic of a portion of a dynamic memory and coupled static memory incorporating a static memory equilibrate circuit.

The integrated circuit in FIG. 4 has as dynamic memory and sense amplifiers as explained above with reference to FIG. 2. The static memory cell 201, however, includes an equilibrate transistor 202 with a source connected to node 204 and a drain connected to node 206. The equilibrate transistor has a gate connected to a SAM EQ line. The SAM EQ line is connected to transistor 208 which has a source connected to Vcc/2 and a drain connected to a pull down transistor 210. The pull down transistor has its gate connected to a static float node (SFLT*). The drain of the pull down transistor and the source of transistor 208 are both connected to the sources of transistors 212 and 214 and referred to as SAM REFERENCE. Transistors 208 and 210 are used as a bias circuit to bias the SAM REFERENCE potential between a ground potential (when the static memories are holding data) and Vcc/2 (during a read transfer).

The equilibrate circuit allows the static memory cells to be deactivated and equilibrated before the transfer of new data from the dynamic memory occurs, and then reactivated after the data has been coupled to them via the digit lines. A read transfer operation can be realized which is faster than prior read transfer operations. Further, the read transfer can occur earlier in the dynamic memory sensing operation with respect to when the PLatch and NLatch are activated. The equilibrate circuit also allows dynamic memory write-back to occur sooner by shortening the RAS* cycle, and thus pre-charge for the dynamic memory to occur sooner without refresh degradation. Another advantage can be found over prior static memories, in that there is no DC path to ground through the static memory cell. As stated above, the worst case transfer is when the dynamic memory has to over-write data in the static memory cell. During an over-write in a prior circuit, the p-sense amplifiers of the dynamic memory had to shunt current through the cross coupled n-channel transistors 190 and 192 to the ground reference. The SAM REFERENCE line of the equilibrate circuit eliminates the DC current path. This results in a significant current reduction, where the new current used is less than half of prior circuits.

Figure 5:
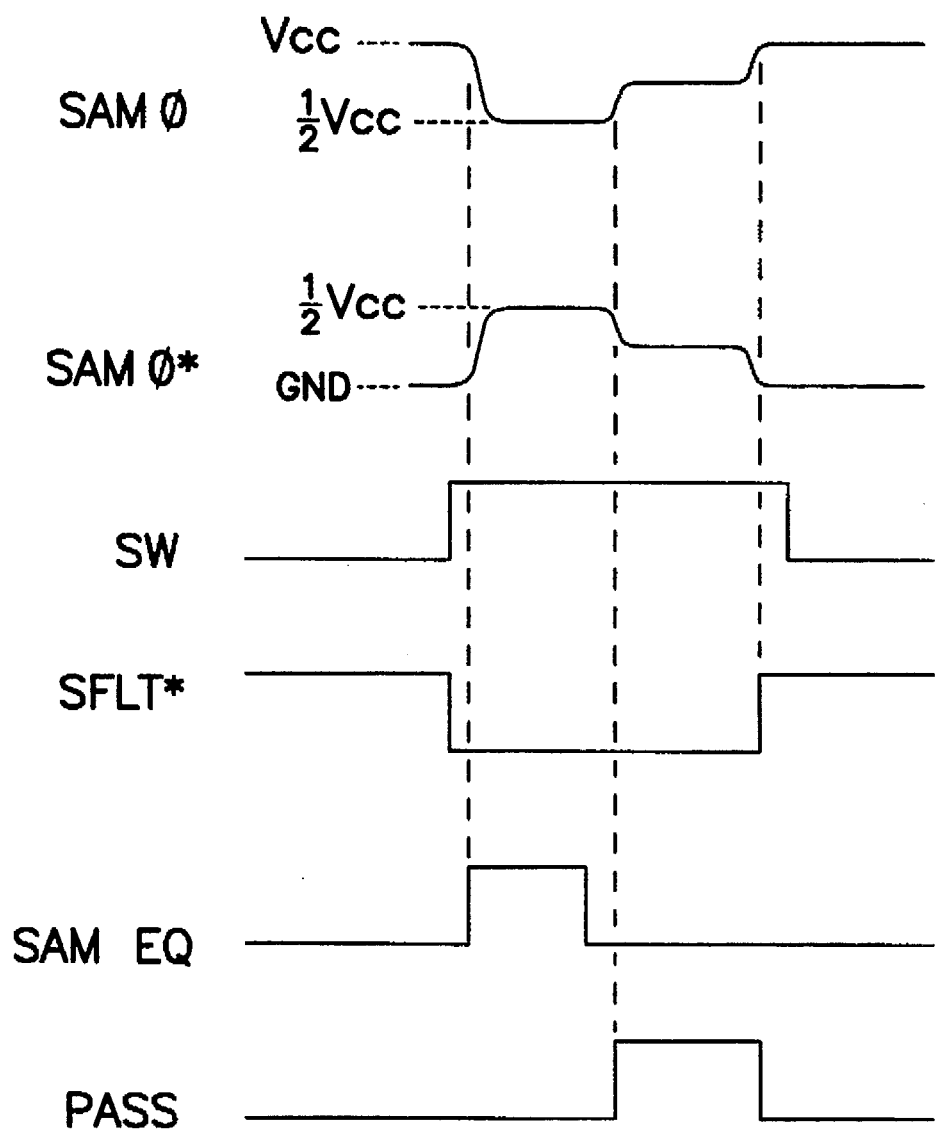
FIG. 5 is a timing diagram of the static memory circuitry of FIG. 4.

Referring to FIG. 5, the timing of the static memory cell during a read transfer operation using the equilibrate circuit is explained. The static memory cell nodes 204 and 206, referred to as SAM 0 and SAM 0*, respectively, are latched at opposite states. To perform a read transfer, the SW line is raised to disable the pull-up transistor 216. At the same time, the SFLT* node goes low to disconnect transistors 212 and 214 from ground. The SAM EQ line then goes high to activate transistors 208 and 202. SAM 0 and SAM 0* are thereby equalized to Vcc/2 through transistors 212 and 214. SAM EQ goes low and the PASS line then goes high to connect the dynamic memory to the static memory cell.

After a differential voltage has been developed on nodes 204 and 206, the PASS line goes low to isolate the static memory cell from the digit lines. The SFLT* node then goes high to pull the sources of transistors 212 and 214 low. These cross coupled n-channel transistors behave as an n-sense amp and latch one node low. The SW line then goes low to pull the sources of transistors 218 and 220 high which behave like a sense amp and pull the other node high.

Figure 6:
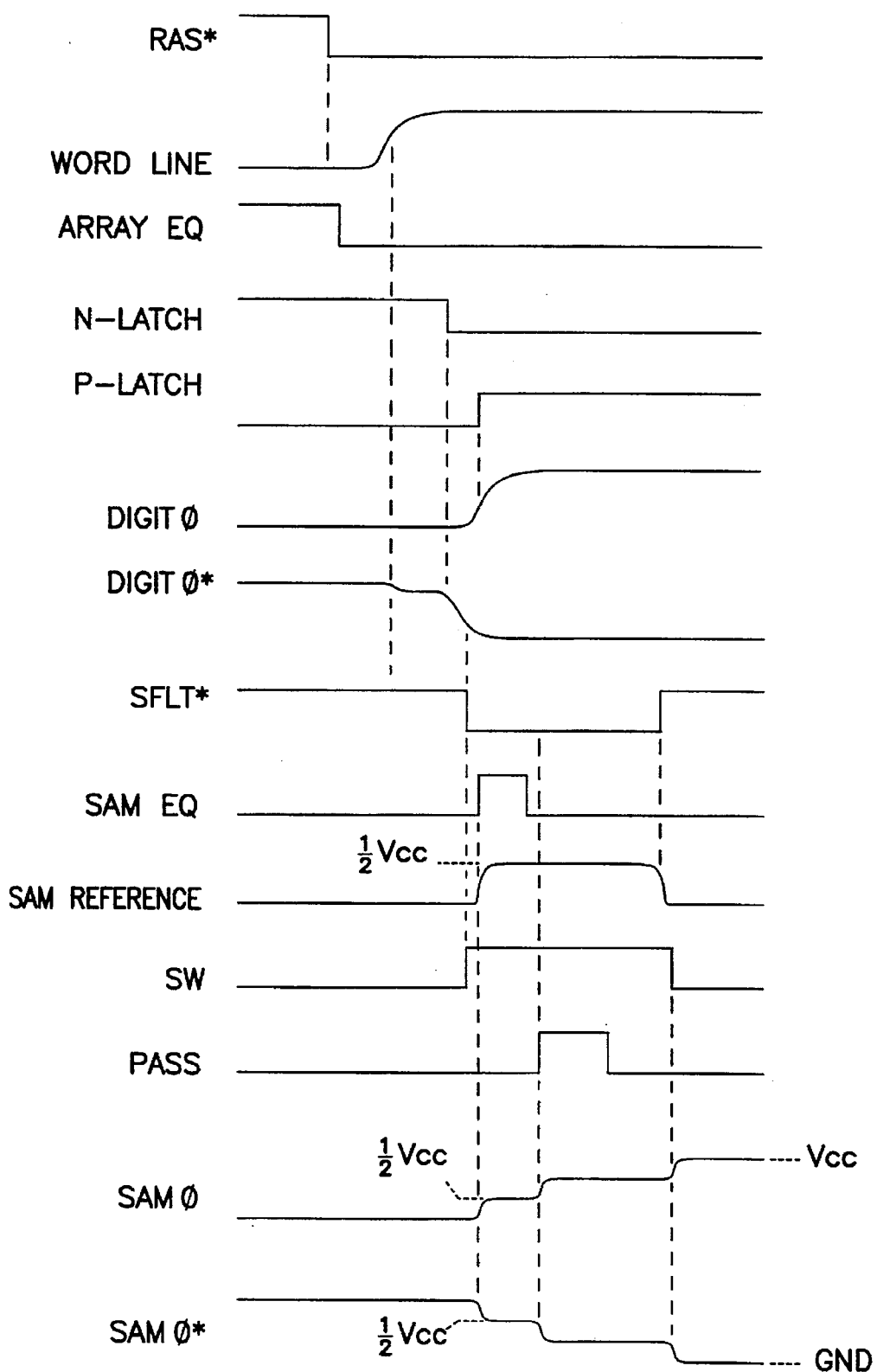
FIG. 6 is a timing diagram of a read transfer operation of FIG. 4.

FIG. 6, illustrates the timing of a multiport memory incorporating the SAM equilibrate circuit during a read transfer operation. The RAS* line goes low to both indicate that a read transfer operation is to be conducted and specify a row address in the dynamic memory. The digit lines of the dynamic memory array which contain the addressed row end equilibration (Array EQ). The word line associated with the addressed row is then charged to a high level. When the word line reaches a sufficient level, the access transistor connected to the addressed memory cell is activated. The charge stored on the dynamic memory cell is then shared with one of the digit lines, Digit 0 or Digit 0*. In this illustration, the addressed dynamic memory cell is connected to the Digit 0* line and lowers the line potential from its equilibrated level. The NLatch line is strobed low so that the digit line having a lower level will begin to be pulled low. After the NLatch line goes low, the SFLT* node goes low to disable the pull down transistors 212 and 214 of the static memory cell. The SW line goes high to disable the pull up transistors 218 and 220 of the static memory cell. The SAM EQ line is pulsed high to equalize the static memory cell nodes SAM 0 and SAM 0* to Vcc/2 by pulling the SAM REFERENCE line to Vcc/2. After the static memory is equalized, the PASS line is pulsed high to connect the two memories. It will be realized that the dynamic memory and the static memory can be operated independently until the SFLT* line goes low. This allows the static memory equalization process to proceed while the dynamic memory sensing function is being performed. The SAM 0 and SAM 0* nodes are coupled to the Digit 0 and Digit 0* lines. The SFLT* and SW lines are toggled after the PASS line returns low to force the static memory cell nodes to full power rails, as detailed above. By lowering the PASS line prior to toggling the SFLT* and SW lines, the static memory and the dynamic memory can be operated independently. It will be understood, however, that the PASS line can remain high while the SFLT* and SW lines are toggled. The static memory and the sense amplifiers would then work together to drive the digit lines to the power rails.

It will be understood that the dynamic memory sense amps do not have to overwrite the static memory cell. By equilibrating the static memory, data can be transferred from the dynamic memory to the static memory as soon as a differential voltage in the order of 100–200 mv is present on the digit lines. That is, the digit lines do not have to be at full rail to transfer data. Prior read transfer operations required the dynamic memory sense amplifiers to swing the voltage levels inside the static memory cell. These voltage swings were approximately 2–3 volts and placed a heavy current drain on the digit line sense amps. The current requirements become apparent when a dynamic memory must over-write several thousand static memory cells. Because of this large current drain, read transfers are the most power hungry cycle/mode on a VRAM.

Single Ended Transfers

While equilibrating the SAM allows for the transfer current to be reduced, it can also be used to provide a single ended transfer line which is used to transfer data between at least one DRAM array and a static register, or SAM. The single transfer line allows for efficient implementation of a multi-port architecture, wherein the static register's are located in one central location which would require only one SAM Decoder in place of conventional multiple SAM Decoders. Further, this one equilibrated SAM can electronically communicate with multiple arrays of DRAM, thus greatly improving the efficiency of the DRAM array blocks. Prior art transferred data between the DRAM and static register in a differential fashion with both Digit and Digit* connected to the static cell via a pass gate. See U.S. Pat. No. 5,265,050 entitled Integrated Circuit Memory with Isolation of Column Line Portions Through P-Sense Amplification Period and U.S. Pat. No. 5,394,172 entitled VRAM Having Isolation Array Sections for Providing Write Functions That Will Not Affect Other Array Sections, Both Assigned to the Assignee of the Present Invention, for demonstrations of this differential coupling method and architecture for dual port DRAMs.

Typical DRAM's fabricated using modern process rules at the 16 megabyte level of integration must "inner-digitate" the sense amp portion of the array. This inner-digitation is required because there is not room for efficiently putting the sense amps on pitch with the columns. In an ideal memory circuit each sense amp would be on the same pitch with the memory array such that each digit line pair had its own sense amp. With a single pitch, the sense amps can all be located on one side of the memory array with the static registers placed on the other end of the array. This is shown in U.S. Pat. No. 5,265,050 and U.S. Pat No. 5,394,172, supra.

Figure 7:
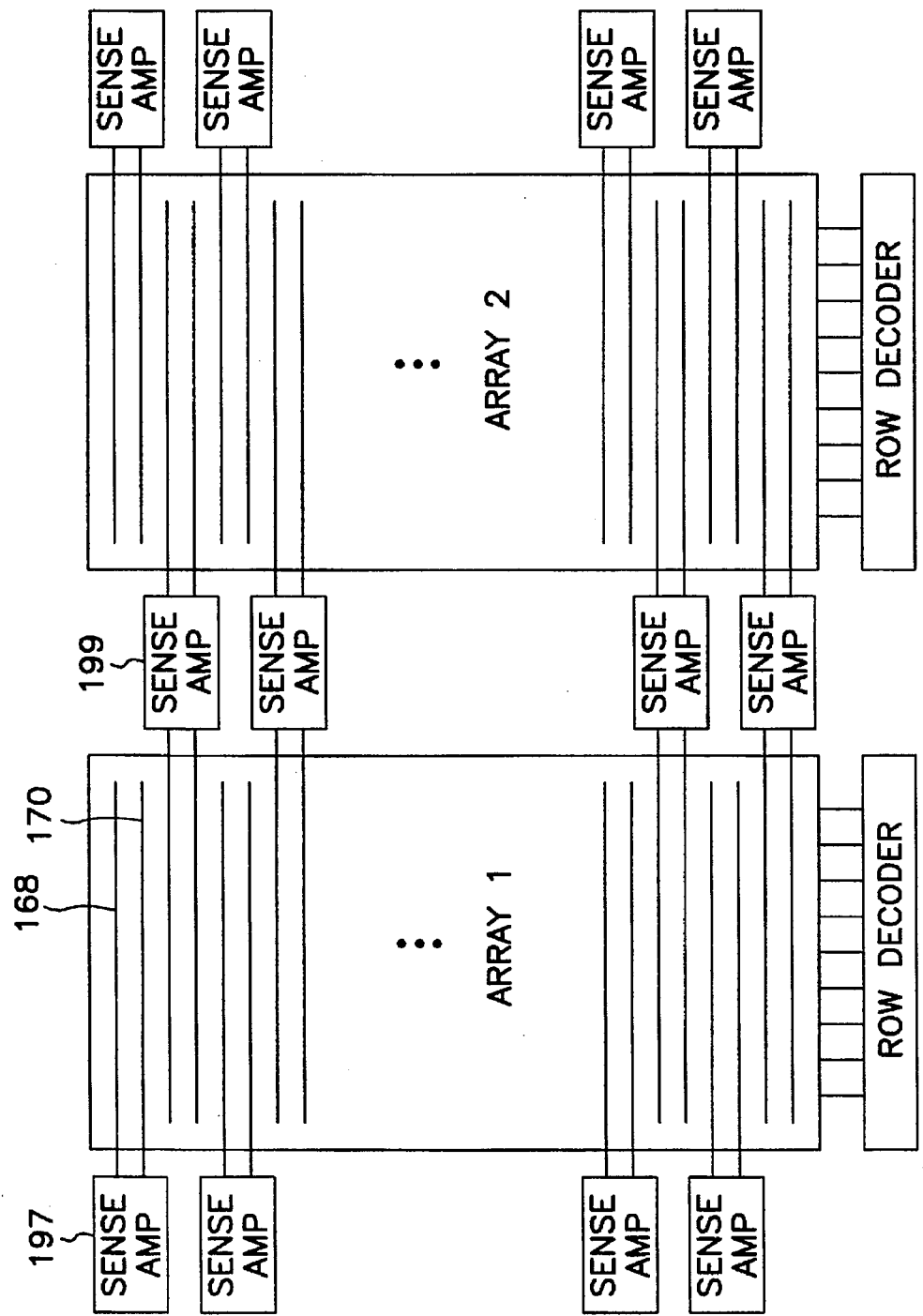
FIG. 7 illustrates a layout for sense amplifiers and DRAM arrays.

As the size of the memory arrays decrease to provide additional memory capacity, the sense amps and their communication lines have not been decreased proportionately in size. Thus, the sense amps are inner-digitated so that there is one sense amp 197 associated with one column on one end of the array and the sense amplifier 199 for the next column is at the other end of the array, as seen in FIG. 7. The columns are defined by one pair of Digit 168 and Digit* 170 lines. Further, the sense amps 199 are typically shared between two arrays (Array 1 and Array 2) for efficiency.

Referring to FIG. 7, two lines, Digit and Digit*, from each array are connected to each sense amp. The sense amps are effectively double pitched as opposed to single pitched as they were in older DRAM architectures. The change from single pitched sense amps to a dual pitched inner-digitated sense amp approach creates a problem for the multi-ported or seen that it is not feature. It can be seen that it is not feasible from a die size point of view to easily integrate static registers or SAM's adjacent the sense amplifiers in the DRAM. As well, the requirement of making the static registers accessible via a decoder of some kind would increase the number of decoders required with single pitched sense amps. This is a result of the distributed nature of the sense amplifiers. Other architectural drawbacks can be overcome by the current invention, as explained below.

The present invention provides a memory circuit wherein one static register or SAM may electronically communicate with multiple array blocks of DRAM. The invention also describes a method of operating the new hardware in such a way to accomplish both Read and Write transfers of data with the DRAM. Both smaller die size and reduced power consumption are realized with the present invention.

Figure 8:
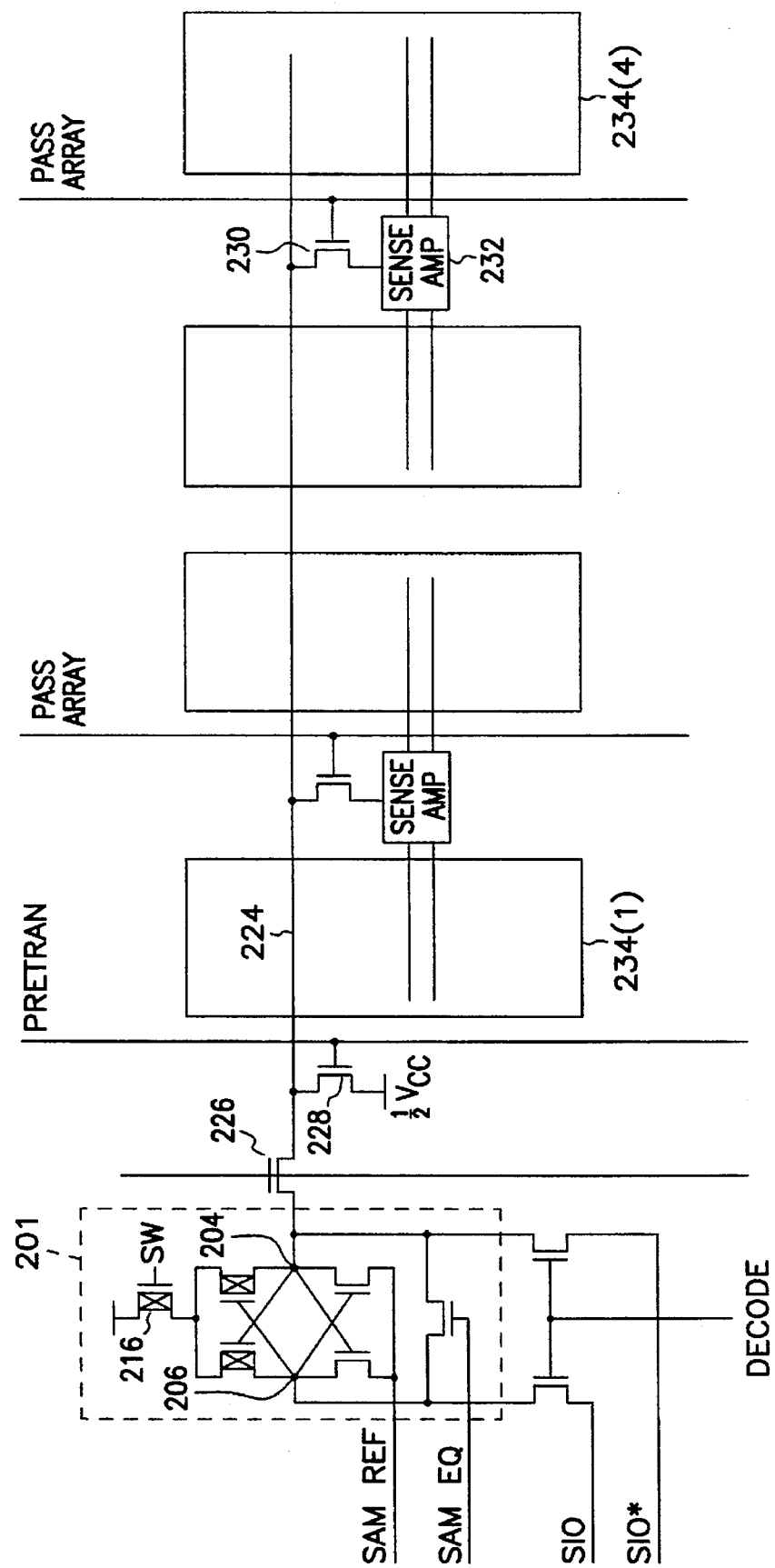
FIG. 8 is a single line transfer circuit connecting a static memory cell to several DRAM arrays.

FIG. 8 shows one embodiment of the single ended SAM transfer circuit. The static memory cell 201 is the same as described with reference to FIG. 4 above. Node 204 and Node 206, however, are not connected to Digit and Digit* lines. Node 204 is coupled to a transfer line 224 through an isolation n-channel transistor 226. The gate of transistor 226 is connected to a SAM Pass line which is used to selectively couple the SAM to the DRAM memory array. The transfer line 224 is connected to the drain of an n-channel equilibrate transistor 228. Transistor. 228 has its gate connected to a PRETRAN line and operates to pre-charge, or equilibrate, the transfer line 224 to a potential of Vcc/2 prior to performing a transfer, as explained in greater detail below.

The transfer line 224 is selectively coupled to the sense amps 232 of several memory arrays 234(1)–(4) through coupling transistors 230. The coupling transistors can be selectively addressed using the Pass Array lines connected to the transistors' gates, such that one array can be selectively coupled to the transfer line for transferring data with the SAM. The sense amps 232 are connected to Digit and Digit* lines for accessing dynamic memory cells, as known to one skilled in the art.

Figure 9:
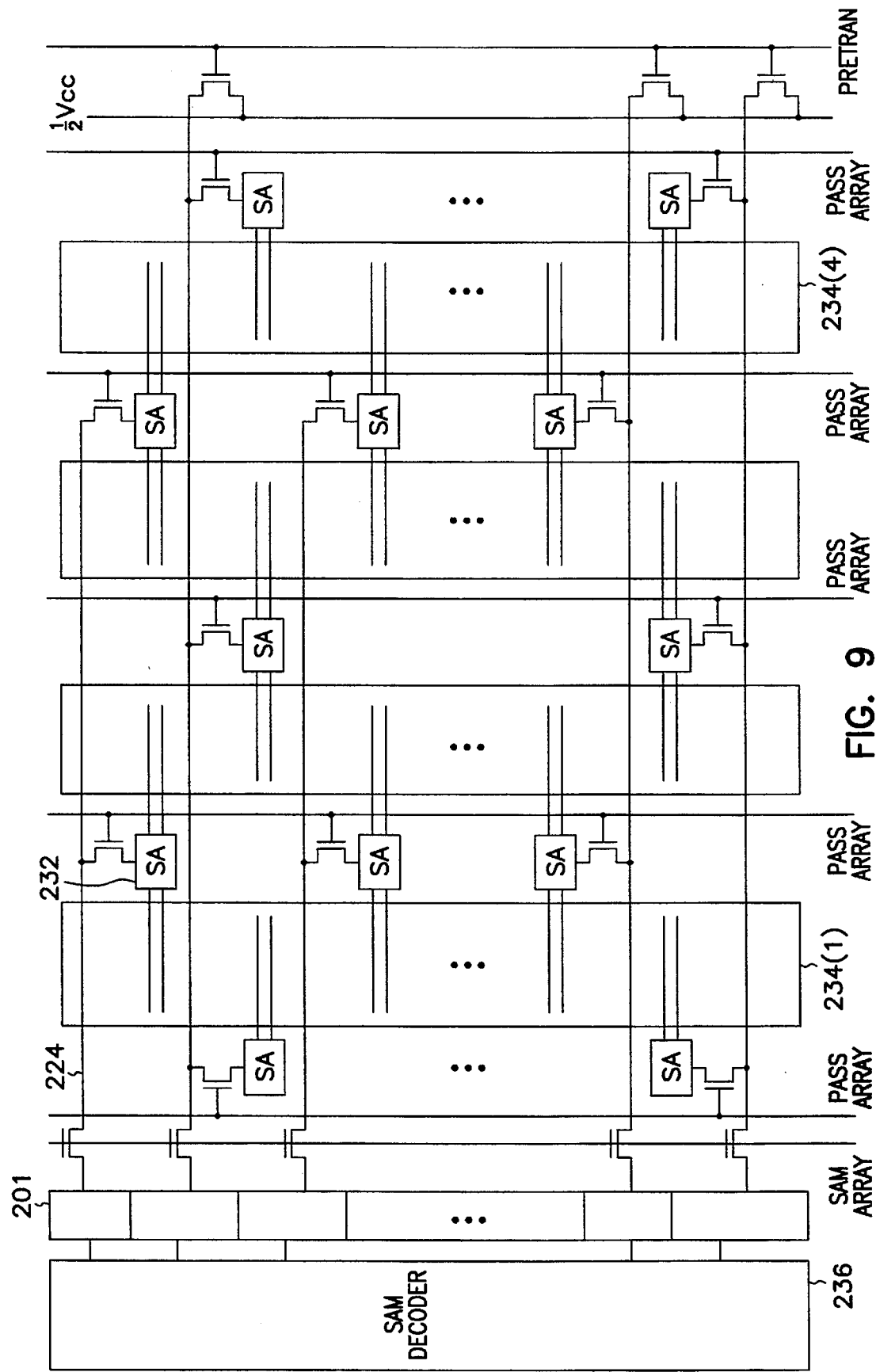
FIG. 9 illustrates several single line transfer circuits between a SAM and four DRAM arrays.

FIG. 9 illustrates a more complete embodiment of one memory architecture for coupling four memory arrays 234 (1)–(4) to the static memory cells 201. A SAM decoder is shown connected to the static memory cells for decoding a SAM address and controlling input and output therefrom. Each static memory cell electrically communicates with multiple memory array blocks of the DRAM. This is different from traditional transfer circuits where a static memory cell electrically communicated with one memory array block of DRAM. As stated above, a single transfer line 224 is used to transfer between the DRAM memory blocks and the static cells 201. In contrast, traditional memories used a pure differential, or 2 conductor transfer system to couple the DRAM to the static cell. The sense amps 232 are inner-digitated, or staggered for efficiency. Therefore, more than one memory array can share a sense amp and the total number of sense amps can be reduced.

Figure 10:
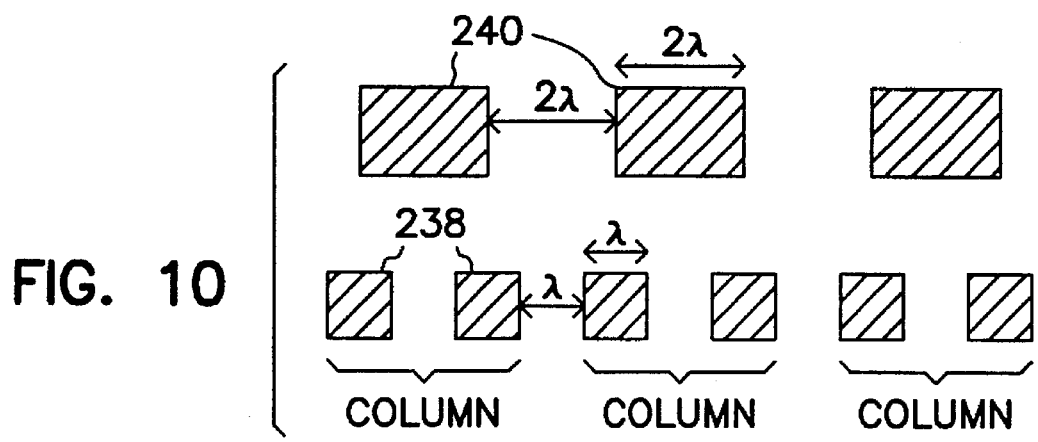
FIG. 10 shows a cross section of a DRAM die having metal column lines and metal transfer lines.

To further illustrate the difficulty in using a differential transfer circuit, a simplified cross section of a typical dynamic memory is shown in FIG. 10. Typically, a DRAM uses the first level of metal, or metal one, to construct the Digit and Digit* lines 238 in the DRAM array. For array layout efficiency considerations, the transfer lines are usually constructed on a second level of metal conductors, or metal two. For reasons known in the industry, the metal two width and spacing are not allowed to be reduced to the metal one geometries. One reason for the spacing requirements is that in DRAM the metal two is used for the main peripheral circuit communication and power bus. The metal two, therefore, is greater than that of the metal one for power considerations. Two metal two conductors must be used to construct a memory using a differential transfer technique. It can be seen that the spacing requirements would prohibit a differential transfer circuit from being fabricated within the same die area as that occupied by the digit line pairs. Using a single transfer line 224, however, a transfer circuit can be implemented without requiring additional integrated circuit die area.

The following is a discussion of a method of operating the single transfer line memory circuit to perform a READ from the DRAM to the SAM, and a WRITE transfer where data from the SAM is written into the DRAM. The underlying operation in both transfers is to provide a signal on the single transfer line 224 which is then coupled to either an equilibrated SAM cell for a READ transfer, or coupled to an equilibrated DRAM sense amp for a WRITE Transfer.

Figure 11:
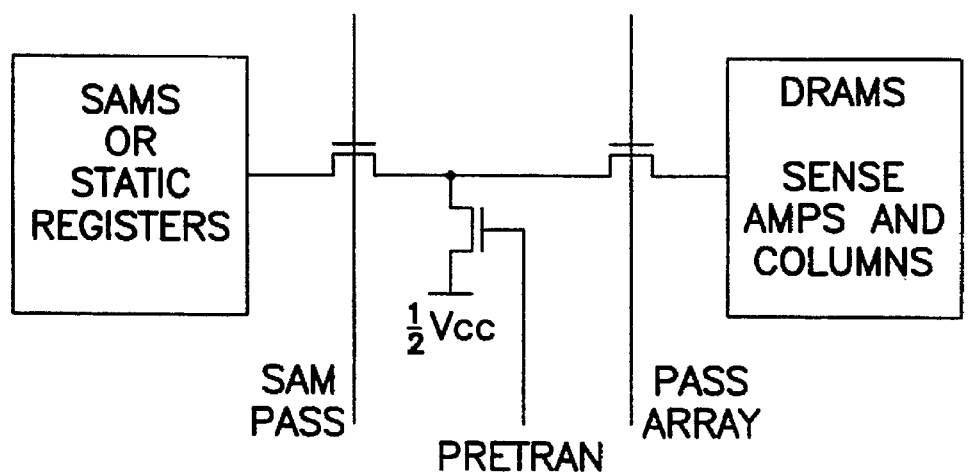
FIG. 11 is a simplified block diagram of the transfer between a SAM and a DRAM using the circuit of FIG. 8.

The basic transfer methods are based upon a register to register transfer, where the register to be over-written is in an equilibrated or pre-charged state, and the register providing the data is in an actively driven state. The two registers selected are coupled together by the single transfer line circuit. Referring to FIG. 11, a simplified block diagram of the memory circuit is provided. The serial memory is coupled to a DRAM by a single transfer line. The transfer line can be equilibrated, the DRAM comprises memory cells, sense amps and digit lines, and the SAM can be equilibrated. Further, the present single transfer line circuit can be incorporated into a memory where several static memories are coupled to several dynamic memories.

Figure 12:
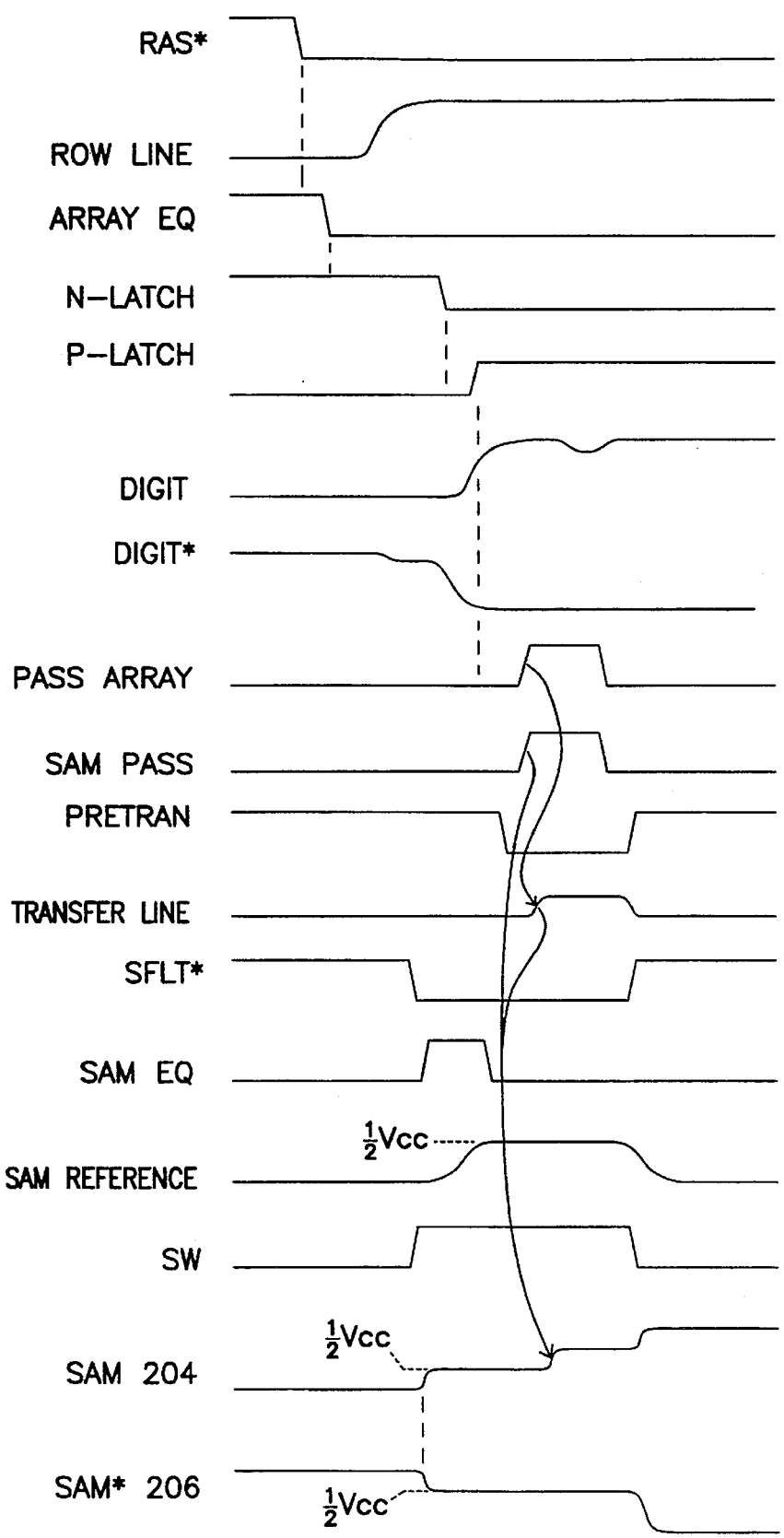
FIG. 12 is a timing diagram of a read transfer using the circuit of FIG. 8.

In reference to FIG. 12, the READ transfer operation is described in detail. To begin the transfer, the RAS* line goes low and a READ transfer command is decoded from the integrated circuit external inputs as known to one skilled in the art. The DRAM array equilibration is then ended by lowering the Array EQ line. The selected Row line goes high dumping the memory cell charge onto the Digit and Digit* lines. In this illustration, the memory cell contained a logical zero which pulls the Digit* line low when connected thereto. The voltage levels of the Digit and Digit* lines are then sensed by the activation of the sense amps via the NLatch and PLatch lines, as explained above.

After the sense amps have been strobed using the NLatch and PLatch lines, the Digit and Digit* lines differentially separate to their respective full power and ground rails. At-this point the SAM memory cell nodes 204 and 206 are equilibrated and pre-charged to Vcc/2, as explained with reference to FIG. 6. It will be recognized that the SAM and the DRAM are isolated when SAM PASS is low and the SAM cells could be equilibrated earlier in the cycle. Next PRETRAN is lowered to turn-off transistor 228 ending pre-charge of the transfer line 224 to Vcc/2.

One of the PASS ARRAY lines is activated high to couple the Digit line signal to the transfer line through transistor 230. The SAM PASS line is then activated to couple the transfer line 224 to the SAM cell 201 through transistor 226. Note that the signal SAM EQ goes low prior to the activation of SAM PASS so that a signal may then be coupled from the transfer line 224 into the SAM cell. After an appropriate amount of signal is coupled into the SAM cell (a predetermined voltage change, $\Delta V$), PASS ARRAY and PASS SAM are deactivated to end the coupling from the DRAM memory cells to the SAM cells. The SAM cell references are then reactivated. That is, SFLT* goes high pulling SAM REFERENCE to ground through transistor 210 and SW goes low re-enabling the SAM cell pull up transistor 216. The PRETRAN line can be reactivated to pre-charge the transfer line back to Vcc/2 for future transfer operations.

Figure 13:
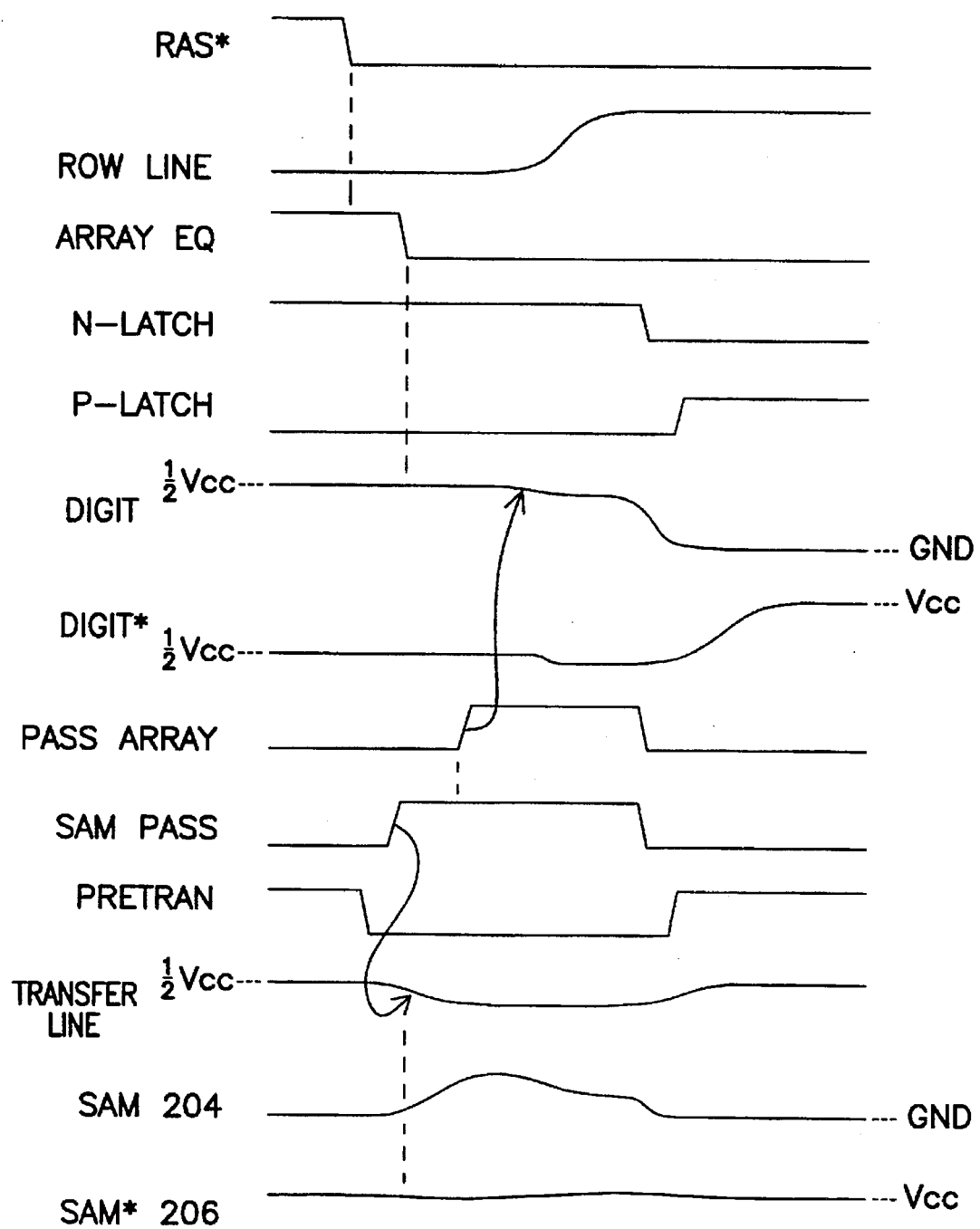
FIG. 13 is a timing diagram of a write transfer using the circuit of FIG. 8.

In reference to FIG. 13, the WRITE transfer operation is described in detail. To begin the transfer, the RAS* line goes low and a WRITE transfer command is decoded from the external inputs, as known to one skilled in the art. The PRETRAN line is lowered to turn transistor 228 off. The signal PASS SAM is then pulled high to couple the SAM cells 201 to the transfer line 224. Prior to the PASS SAM going high, the SAM nodes 204 and 206 are at the opposite power rails. In FIG. 13, the SAM cell is storing a logical zero such that SAM* node 206 is at Vcc, and SAM node 204 is at ground. Activating the PASS SAM line results in the immediate signal development on the transfer line 224. SAM node 204 will be pulled slightly high as the pre-charge voltage on the transfer line is coupled low. The DRAM ARRAY EQ line is lowered to turn off the equilibrate transistor 171. As detailed above, the equilibrate transistor 171 is connected between the two Digit lines to selectively equalize the voltage of the Digit lines. After the ARRAY EQ line is lowered, one of the PASS ARRAY lines go high to couple the Digit line to the transfer line. A row line 165 is activated to selectively couple a DRAM memory cell 162 to the Digit or Digit* line through transistor 164. FIG. 13, illustrates a logical zero stored on a memory cell coupled to the Digit* line, as evidenced by the decrease in the Digit* voltage after the row line goes high.

It will be recognized that to over-write the DRAM memory cell the signal from the transfer line 224 must be larger than the signal change resulting from the DRAM memory cell. That is, the change in the Digit line voltage ($\Delta V_{Digit}$) must be greater than the Digit* line voltage ($\Delta V_{Digit*}$). This results in the DRAM Digit pair or column being over-written. Thus, even though Digit* went low when the DRAM cell was coupled thereto, it ultimately goes high because it was not lower in voltage than the Digit line after fie SAM transfer.

After the DRAM memory cell is coupled to one of the Digit lines, the PASS ARRAY and PASS SAM lines are lowered to de-couple the DRAM and SAM from the transfer line. With the Digit lines isolated from the transfer line, the DRAM sense amps are strobe with the NLatch and PLatch signals causing the voltages on Digit and Digit* to be sensed and amplified to their respective power rails. Finally, the PRETRAN line can be re-enabled to pre-charge the transfer line to Vcc/2 in preparation for the next transfer operation.

Figure 14:
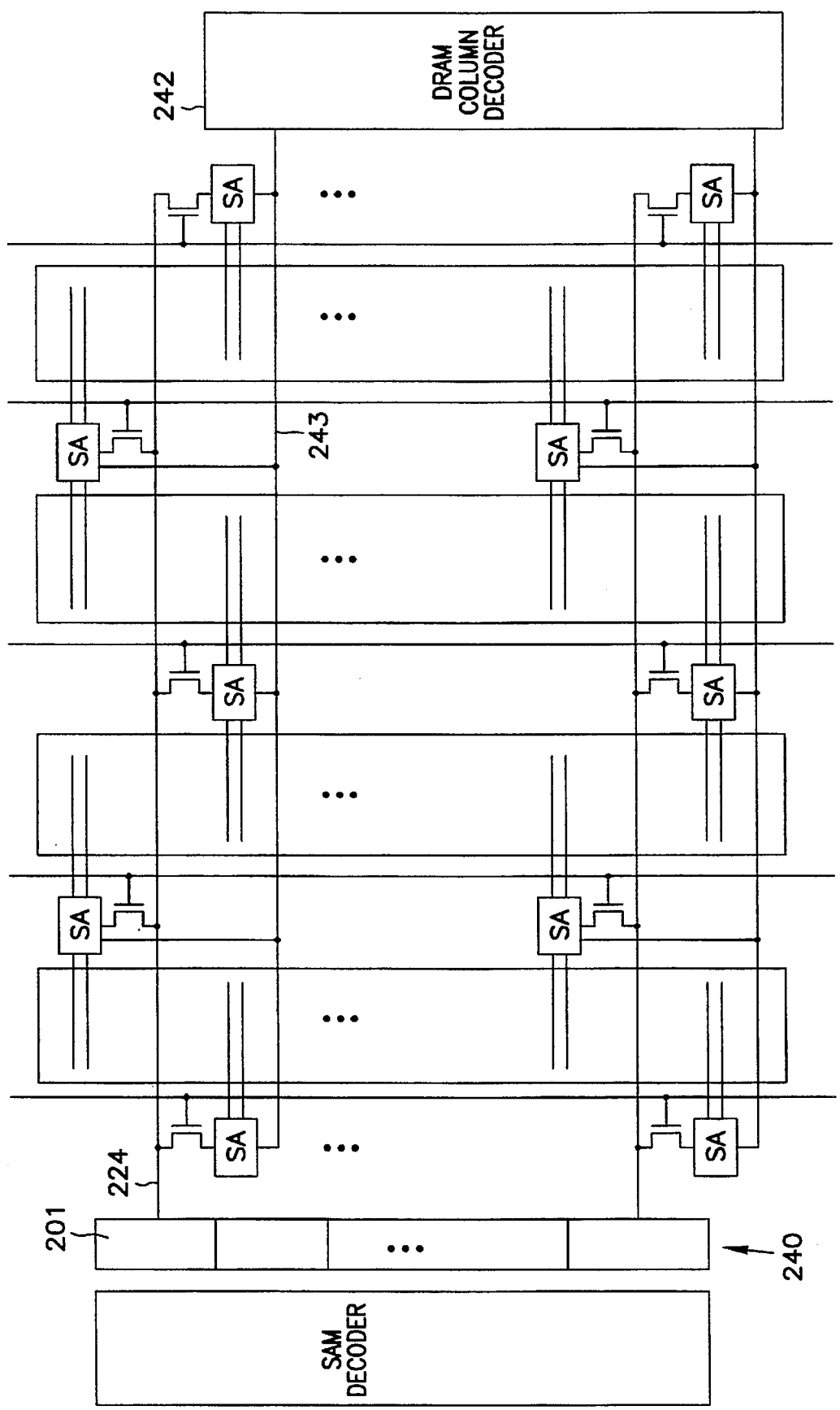
FIG. 14 is a split SAM coupled to a DRAM using the circuit of FIG. 8.

It should be noted that this invention is very applicable to CACHE DRAM type parts, where a parallel static register is used to electrically communicate with a DRAM array. Further, another embodiment involves a single ended transfer using a half length SAM device 240, as known to one skilled in the art. As seen in FIG. 14, one SAM memory cell 201 is provided for every two DRAM columns. In this memory one transfer line 224 is coupled to two pairs of Digit lines of one DRAM array. This allows a column decode circuit to provide select signals on the unused metal two line 243 for random access operations to the DRAM arrays, as is well known in the art.

Conclusion

A single transfer line circuit has been described for transferring data between a static memory and a dynamic memory. The static memory can be equilibrated to a predetermined voltage level. The single transfer line can also be pre-charged to the predetermined voltage level. Methods of selectively coupling and equilibrating the elements are described for either Read or Write transferring between the memories. This circuit allows one static memory to be efficiently coupled to several dynamic memory arrays while reducing the die area needed for communication lines.

What is claimed is:

1. An integrated memory circuit comprising:

a dynamic memory array having a plurality dynamic memory cells;

a static memory having a plurality of static memory cells;

a plurality of single transfer lines coupled to the static memory and the dynamic memory, each for transferring data between one of the plurality of dynamic memory cells and one of the static memory cells;

a pre-charge circuit connected to the plurality of single transfer lines for charging the plurality of single transfer lines to a pre-determined voltage level;

pass circuitry electronically located between the static memory and the plurality of single transfer lines for selectively coupling the plurality of static memory cells to the plurality of single transfer lines;

memory cell pass circuit electrically located between the plurality of dynamic memory cells and the plurality of single transfer lines, for selectively coupling one of the plurality of dynamic memory cells to one of the plurality of single transfer lines; and equilibration circuitry connected to the plurality of static memory cells for equilibrating the plurality of static memory cells to a predetermined voltage level.

2. The integrated memory circuit of claim 1 where:

each of the plurality of static memory cells comprise first and second nodes; and the equilibrate circuit comprises a transistor connected between the first and second nodes.

3. The integrated memory circuit of claim 1 wherein the pre-charge circuit comprises:

a charging transistor having a drain connected to the plurality of single transfer lines, a source connected to the pre-determined voltage level, and a gate connected to receive an activation signal.

4. An integrated memory circuit comprising:

a dynamic memory array having a plurality dynamic memory cells;

a static memory having a plurality of static memory cells;

a plurality of single transfer lines coupled to the static memory and the dynamic memory, each for transferring data between one of the plurality of dynamic memory cells and one of the static memory cells;

a pre-charge circuit connected to the plurality of single transfer lines for charging the plurality of single transfer lines to a pre-determined voltage level; and equilibration circuitry connected to the plurality of static memory cells for equilibrating the plurality of static memory cells to a predetermined voltage level.

5. The integrated memory circuit of claim 4 where the dynamic memory array is arranged in a plurality of columns having a plurality of dynamic memory cells and the plurality of single transfer lines are selectively coupled to two columns of the dynamic memory array, for selectively transferring data between one of the plurality of dynamic memory cells of one of the two columns and one of the static memory cells.

6. The integrated memory circuit of claim 4 wherein the pre-charge circuit comprises:

a charging transistor having a drain connected to the plurality of single transfer lines, a source connected to the pre-determined voltage level, and a gate connected to receive an activation signal.

7. The integrated memory circuit of claim 4 further including pass circuitry electronically located between the static memory and the plurality of single transfer lines for selectively coupling the plurality of static memory cells to the plurality of single transfer lines.

8. The integrated memory circuit of claim 4 further including memory cell pass circuit electrically located between the plurality of dynamic memory cells and the plurality of single transfer lines, for selectively coupling one of the plurality of dynamic memory cells to one of the plurality of single transfer lines.

9. The integrated memory circuit of claim 4 where:

each of the plurality of static memory cells comprise first and second nodes; and the equilibrate circuit comprises a transistor connected between the first and second nodes.

10. The integrated memory circuit of claim 9 further including a bias circuit for electrically coupling the first and second nodes to a predetermined potential.

11. A method of reading data from a dynamic memory array having a plurality of dynamic memory cells with a static memory having a plurality of static memory cells, the method comprising the steps of:

equilibrating the plurality of static memory cells to a predetermined voltage level;

pre-charging a single transfer line to the predetermined voltage level;

coupling one of the plurality of dynamic memory cells to a sense amplifier;

selectively coupling the sense amplifier to the single transfer line; and selectively coupling one of the plurality of static memory cells to the single transfer line.

12. The method of claim 9 further including the steps of:

transferring a voltage to the one of the plurality of static memory cells;

electrically isolating the one of the plurality of static memory cells from the single transfer line; and latching the voltage with the one of the plurality of static memory cells.

13. The method of claim 11 wherein the predetermined voltage level is one-half of a supply voltage (Vcc).

* * * * *